(12) United States Patent
Shieh et al.

(10) Patent No.: US 7,476,472 B2
(45) Date of Patent: Jan. 13, 2009

(54) METHOD FOR DESIGNING PHOTOMASK

(75) Inventors: Ming-Feng Shieh, Tainan County (TW); Benjamin Szu-Min Lin, Hsinchu (TW); Chun-Chi Yu, Taipei (TW); Jian-Shin Liou, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 734 days.

(21) Appl. No.: 11/161,084

(22) Filed: Jul. 22, 2005

(65) Prior Publication Data

US 2007/0020532 A1    Jan. 25, 2007

(51) Int. Cl.
*G03F 1/00*    (2006.01)
(52) U.S. Cl. ........................................... 430/5

(58) Field of Classification Search ............... 430/5, 430/394
See application file for complete search history.

(56) References Cited

U.S. PATENT DOCUMENTS 7,001,694 B2 *   2/2006   Misaka ..................... 430/5

* cited by examiner

*Primary Examiner*—Stephen Rosasco
(74) *Attorney, Agent, or Firm*—Jianq Chyun IP Office

(57) ABSTRACT

The present invention provides a method for designing a mask. First, a main pattern including at least a strip pattern is formed on the mask substrate. A shift feature is added to one end of the strip pattern of the main pattern. Either the phase shift or the optical transmission or both of the shift feature can be adjusted to optimize the resultant critical dimension between line-ends of the main pattern, thus improving pull-back of the line-ends of the strip pattern in the main pattern.

8 Claims, 3 Drawing Sheets

METHOD FOR DESIGNING PHOTOMASK

BACKGROUND OF THE INVENTION

1. Field of Invention

The present invention relates to a method of designing photomasks. More particularly, the present invention relates to a method of designing photomasks by adjusting the phase shift and/or the optical transmission of the mask pattern.

2. Description of Related Art

Due to the rapid development of integrated circuit techniques, device miniaturization and integration is a common trend. In the process of fabricating an integrated circuit, photolithographic processes have major influences on the ultimate operating characteristics of the fabricated devices. As the level of integration continues to increase, device dimensions as well as distance of separation between neighboring devices are reduced correspondingly. Consequently, a pattern transferred to a silicon chip using a photolithographic process may result in some deviation. For example, line-ends of a line pattern may be pulled up (reduced) or sharp corners in the pattern may be rounded. The aforementioned deviations have great negative effect on the integrated circuit as dimensions of devices are relatively small or the level of integration is high. If there is a deviated reduction in the line-end when a pattern is transferred to a silicon chip, pattern misalignment may occur and the process window tolerance is decreased.

In order to increase the pattern transfer fidelity and the resolution of photolithographic processes, many technologies, such as, phase shift mask (PSM) and optical proximity correction (OPC), have been developed.

The basic concept of phase shift masks is to add a shifter layer between adjacent apertures of the mask patterns, causing a 180-degree phase shifting of the light. The shifter layer can reverse the phase and induce interference, thus enhancing resolution for the images at the wafer. The shifter layer can be designed with a specific thickness and a refractive index in order to cause a 180-degree phase shift, so that diffraction from adjacent apertures can be cancelled out, thus increasing the exposure resolution and improving uniformity for critical dimensions of the device.

Similarly, to prevent variation of critical dimensions in mask pattern transfer, an optical proximity correction procedure is often applied during photomask fabrication. In general, optical proximity correction includes the addition of serifs to the corners or hammerheads to end edges of the original pattern to prevent the rounding of right-angled corners and the pullback of line-ends.

However, when the critical dimension or the distance between neighboring lines has been reduced to a certain extent, addition of serifs or hammerhead patterns or conventional phase shift masks can no longer avoid the undesirable pullback of line-ends effectively.

SUMMARY OF THE INVENTION

Accordingly, one object of the present invention is to provide a method of designing phase shift masks by adjusting the phase shift and/or the optical transmission of the additional shift feature to improve pullback of line-ends in a main pattern. The phase shift and/or the optical transmission of the additional shift feature are set such that the line-ends approach the original design in length, thus affording a higher process window in the fabrication of semiconductor devices.

To achieve these and other advantages and in accordance with the purpose of the invention, as embodied and broadly described herein, the invention provides a method for designing a mask. First, a main pattern including at least a strip pattern is formed on the mask substrate. A shift feature is added to one end of the strip pattern of the main pattern. Either the phase shift or the optical transmission or both of the shift feature can be adjusted to optimize the resultant critical dimension at line-ends. The optical phase difference between the mask substrate and the shift feature ranges from about 60°-100°, while an optical transmission of the shift feature ranges from 60%-100%. Hence, pullback of the line-ends of the strip or line/space patterns of the main pattern after pattern transfer is reduced and the processing window for the main pattern is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
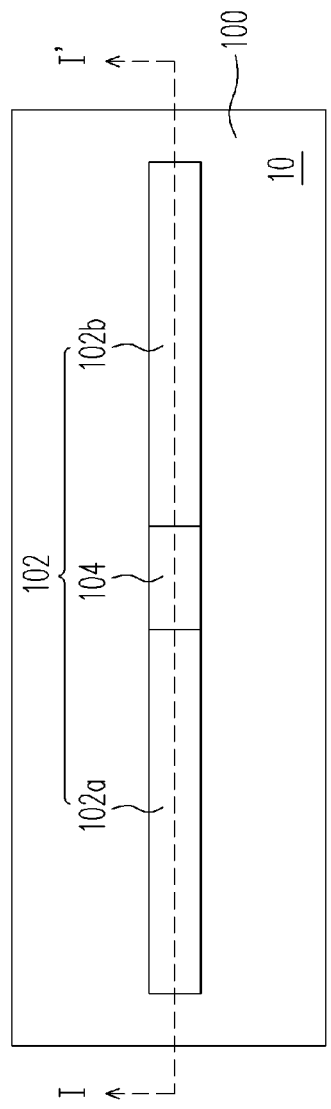
FIG. 1A illustrates a top view of a half-tone PSM according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In general, equipment for carrying out a photolithographic process includes a reticle, also known as a photomask. The reticle includes a pattern that corresponds to the pattern in a particular layer of an integrated circuit. During light exposure, the reticle is placed between a light source and a silicon chip. Light from the light source penetrates the transparent glass layer and projects onto a photoresist layer on the silicon chip. Hence, the pattern on the reticle is transferred to the photoresist layer after development.

However, due to refraction and interference of light and other factors when light passes through the photomask, the transferred pattern is distorted. To produce a faithful reproduction of the original pattern and minimize distortion, a method of fabricating a photomask is provided in this invention. The invention may utilize a half-tone phase shift mask (PSM) or a binary phase shift mask (PSM) to fabricate a desired pattern of semiconductor manufacture. The pattern of the mask has a main pattern and also includes at least a shift region (a shift feature) for improving the line-end shortness problems. By controlling the phase shift and/or the optical transmission of the shift region, strip or line/space patterns, such as polysilicon gate line patterns are fabricated with high fidelity.

FIG. 1A illustrates a top view of a half-tone PSM according to one preferred embodiment of the invention. Referring to FIG. 1, a half-tone phase shift mask 10 according to the preferred embodiment of the invention has a half-tone phase shifter layer 102a, 102b, which is partially transparent, formed on a mask substrate 100. The pattern of the half-tone phase shifter layer 102a, 102b is considered the main pattern 102 of the mask 10, for defining and corresponding to the geometric patterns of a material layer of the semiconductor devices. A shift region 104 is disposed between the opposite ends of the half-tone phase shifter layer 102a, 102b. The location of the shift region 104 corresponds to the space (i.e. critical dimension region) of the geometric patterns of the material layer of the semiconductor devices. By adjusting the phase shift and/or the optical transmission of this shift region 104, the end-to-end distance (i.e. critical dimension) between the opposite ends of the phase shifter layer 102a, 102b can be controlled (or reduced).

The phase shifter layer 102a, 102b induces a 180° phase shift in light passing through the half-tone phase shift mask 10, for example. That is, the optical phase difference between the substrate 100 (considered as 0° phase) and the phase shifter layer 102a, 102b is 180°. On the other hand, the shift region 104 can induce an X° phase shift in light passing through the half-tone phase shift mask 10, for example. That is, the optical phase difference between the substrate 100 and the shift region 104 is X°. For example, X° ranges from about 60°-100°, preferably 90°±10°. It is important to note that the phase shift of the shift region 104 should be adjusted according to the end-to-end CD or pitch of the main pattern.

The optical transmission of a specific material or layer is commonly measured as a transmission (in percentage) of illumination that passes through the material or layer. Similarly, the optical transmission of the shift region can be adjusted along with its phase shift according to the end-to-end CD or pitch of the main pattern. The optical transmission of the shift region ranges from about 60% to 100%, preferably 90%±10%, for example.

Figure 2:
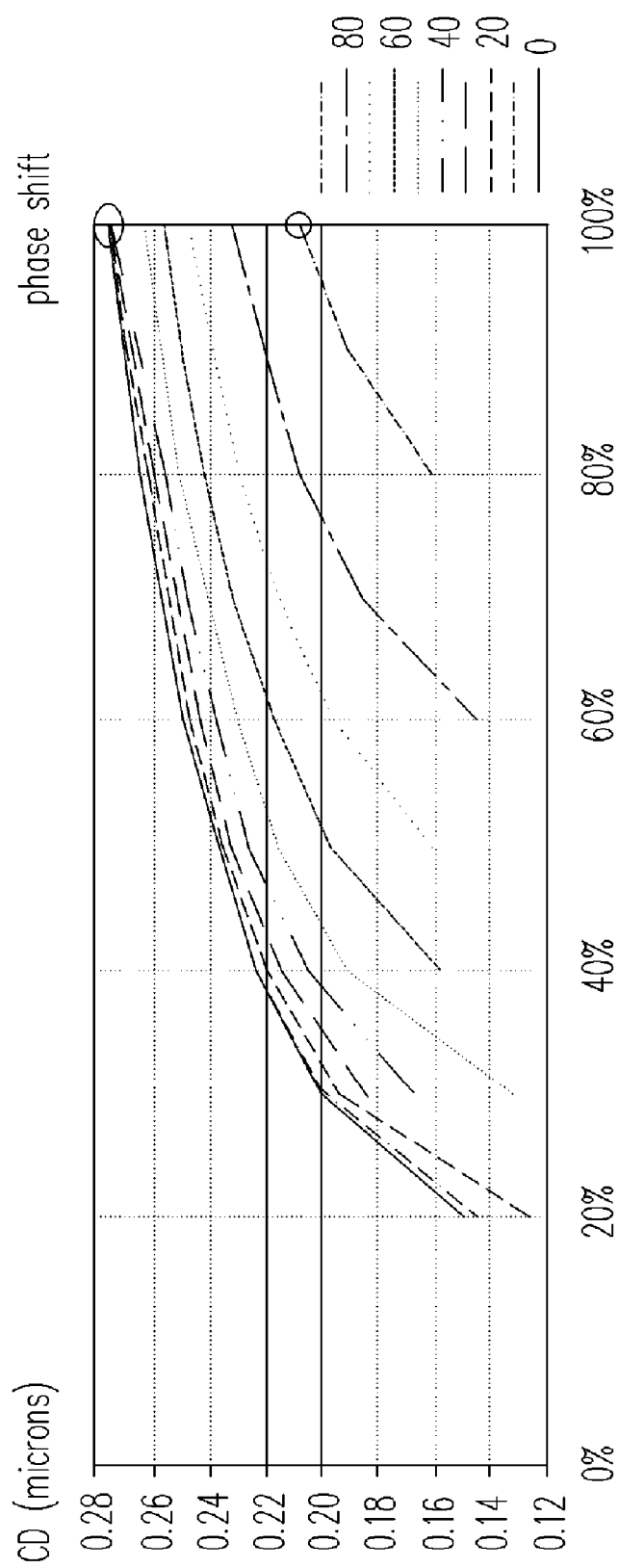
FIG. 2 is a graph illustrating the relationships between the optical transmission sin combination with the phase shifts and the critical dimensions (CD) of the layout pattern.

FIG. 2 is a graph illustrating the relationships between the end-to-end critical dimensions (CD) of the layout pattern and the optical transmissions in combination with the phase shifts of the shift region.

According to FIG. 2, if taking the optical transmission of the shift region as 100% as an example, it clearly shows that the end-to-end CD is about 0.21 microns when the phase shift of the shift region is 90°. In this case, the distance between two opposite ends of strip or line patterns can be as short as about 0.21 microns. However, the end-to-end CD will be about 0.275 microns if the phase shift of the shift region is 0° and the optical transmission of the shift region is 100%. In this case, it is considered that the shift region does not exist, while only the main pattern is formed on the transparent 0°-phase mask substrate. Accordingly, the distance between two opposite ends of lines is as short as about 0.275 microns. Compared these two cases, addition of the shift feature (the shift region) leads to a smaller distance (the end-to-end CD), which indicates an improved (less) pullback of the line ends.

Therefore, it is proposed in the present invention that not only the phase shift but also the optical transmission of the shift region can be adjusted according to the requirements of the critical dimension or pitch in the main pattern. Optimization of the phase shift and/or the optical transmission can be referenced to FIG. 2. As the optical phase difference between the substrate and the shift region is about 60°-100° and the optical transmission of the shift region is about 60%-100%, the resultant end-to-end critical dimension is smaller than about 0.255 microns.

Figure 1B:
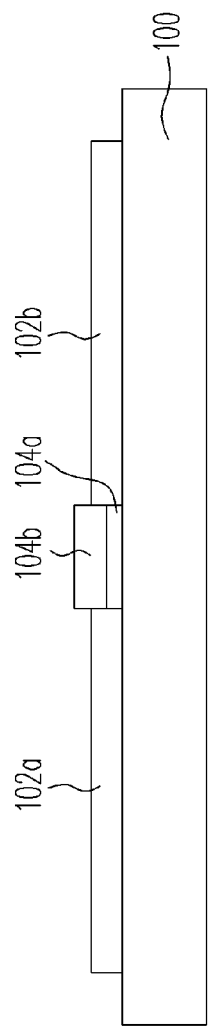
FIG. 1B illustrates a cross-sectional view of FIG. 1A along the line I-I'.

FIG. 1B illustrates a cross-sectional view of FIG. 1A along the line I-I'. As shown in FIG. 1B, the half-tone phase shifter layer 102a/102b is formed on the mask substrate 100 by deposition or sputtering, for example. The mask substrate 100 can be made of a transparent material such as quartz or glass, and the half-tone phase shifter layer 102a,b can be made of MoSizOxNy or chromium oxide with a transmission preferably of about 6%-8%, for example. The transmission of the half-tone phase shifting layer 102a, 102b ranges between 4%-15%, preferably less than 10%. According to one preferred embodiment of the present invention, the shift region 104 may includes a semi-transmitting or semitransparent first material layer 104a for controlling the optical transmission of the shift region and a transparent second material layer 104b for adjusting the phase shift of the shift region. The material choices of the first and second material layers are dependent upon a desired transmission or phase shift of the shift region.

Figure 3A:
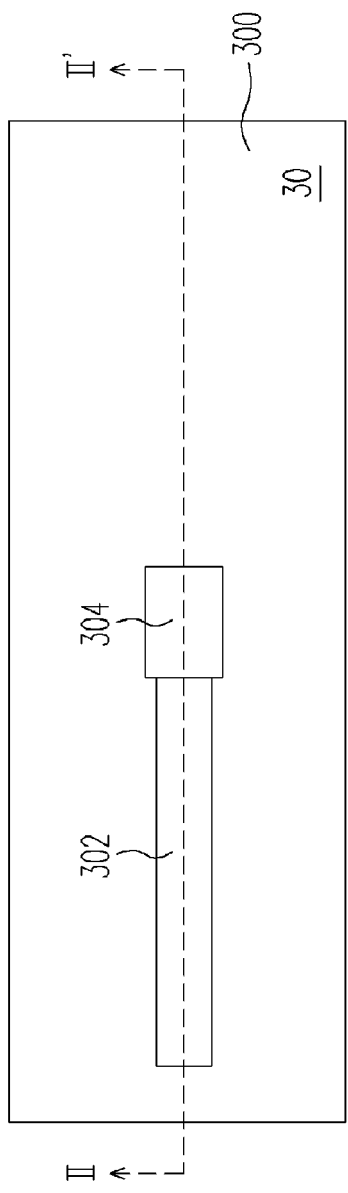
FIG. 3A illustrates a top view of a binary PSM according to another preferred embodiment of the invention.
Figure 3B:
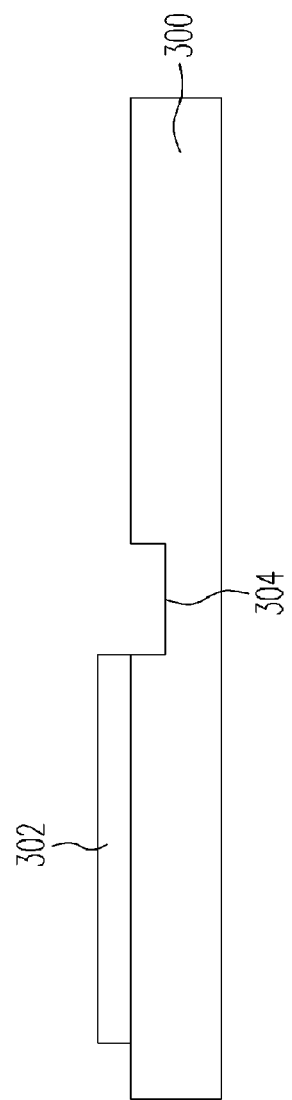
FIG. 3B illustrates a cross-sectional view of FIG. 3A along the line II-II'.

Alternatively, the present invention utilizes a binary phase shift mask (PSM). FIG. 3A illustrates a top view of a binary PSM according to another preferred embodiment of the invention, while FIG. 3B illustrates a cross-sectional view of FIG. 3A along the line II-II'. Referring to FIGS. 3A and 3B, the binary phase shift mask 30 includes a mask layer 302, which is opaque, formed on a mask substrate 100. The pattern of the mask layer 302 is considered the main pattern of the mask 30, for defining and corresponding to the geometric patterns of a material layer of the semiconductor devices. A shift region 304 is disposed at one end of the mask layer 302. The location of the shift region 304 corresponds to the space (i.e. critical dimension region) between a reference point to the geometric patterns of the material layer of the semiconductor devices.

Similarly, the shift region 304 can induce an X° phase shift in light passing through the phase shift mask 30, for example. That is, the optical phase difference between the substrate 300 (considered as 0° phase) and the shift region 304 is X°. For example, X° ranges from about 60°-90°, preferably 90°±10°. Accordingly, the phase shift and/or the optical transmission of the shift region 304 can be adjusted according to the end-to-reference point CD of the main pattern. Referring to FIG. 3B, the mask substrate 300 can be made of a transparent material such as quartz or glass, and the shift region 304 can be formed by over-etching the mask substrate 300 to a predetermined depth, depending on its desired phase shift. The mask layer 302 can be made of chromium, for example.

According to the method and the PSM provided by this invention, the end-to-end critical dimension and pattern distance can be reduced to a level lower than that produced by the conventional method. In other words, pullback of line-ends can effectively be avoided even when the shift feature is added at the line-ends of the main pattern and the phase shift and/or the transmission of the shift feature are optimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for designing a mask, comprising the steps of:
   providing a mask comprising a mask substrate and a main pattern formed thereon, wherein the main pattern includes at least one strip pattern; and
   providing a shift feature to an end of the strip pattern in the main pattern, so that a critical dimension at the end of the strip pattern is smaller than 0.255 microns, wherein an optical phase difference between the mask substrate and the shift feature ranges from about 60°-100°, while an optical transmission of the shift feature ranges from 60%-100%.

2. The method of claim 1, wherein the main pattern includes an opaque mask layer.

3. The method of claim 2, wherein a material of the opaque mask layer is chromium.

4. The method of claim 1, wherein the main pattern includes a phase shifter layer with an optical transmission smaller than about 10%.

5. The method of claim 4, wherein a material of the phase shifter layer is molybdenum silicon oxy-nitride (MoSizOxNy).

6. The method of claim 4, wherein a material of the phase shifter layer is chromium oxide.

7. The method of claim 1, wherein the optical phase difference between the mask substrate and the shift feature ranges from about 80°-100°.

8. The method of claim 1, wherein the optical transmission of the shift feature ranges from 80%-100%.

* * * * *